(12) United States Patent
Zack et al.

(10) Patent No.: US 7,476,040 B2
(45) Date of Patent: Jan. 13, 2009

(54) COMPACT OPTICAL SUB-ASSEMBLY WITH CERAMIC PACKAGE

(75) Inventors: Jeffrey Zack, Melbourne, FL (US); Craig A. Young, Nazareth, PA (US); Anand Shukla, Newtown, PA (US); Wei Xu, West Windsor, NJ (US); William K. Hogan, Merritt Island, FL (US); David Peter Gaio, Rochester, MN (US); Chris Hart, West Melbourne, FL (US); Philip Deane, Indian Harbour Beach, FL (US); Mark J. Bailey, Lake City, MN (US); Martin A. Helfand, Cherry Hill, NJ (US)

(73) Assignee: JDS Uniphase Corporation, Milpitas, CA (US)

( * ) Notice: Subject to any disclaimer, the term of this patent is extended or adjusted under 35 U.S.C. 154(b) by 91 days.

(21) Appl. No.: 11/046,939

(22) Filed: Jan. 31, 2005

(65) Prior Publication Data
US 2005/0185882 A1    Aug. 25, 2005

Related U.S. Application Data

(60) Provisional application No. 60/541,076, filed on Feb. 2, 2004.

(51) Int. Cl.
*G02B 6/42* (2006.01)
(52) U.S. Cl. ...................................... 385/93
(58) Field of Classification Search .................. 385/15
See application file for complete search history.

(56) References Cited

U.S. PATENT DOCUMENTS

| | | | |
|---|---|---|---|
| 4,922,325 A * | 5/1990 | Smeltz, Jr. .................. 257/686 |
| 4,966,439 A * | 10/1990 | Althaus et al. .............. 359/820 |
| 5,005,939 A | 4/1991 | Arvanitakis et al. |
| 5,333,224 A * | 7/1994 | Kikuchi ....................... 385/93 |
| 5,351,330 A * | 9/1994 | Jongewaard ................. 385/93 |
| 5,513,073 A * | 4/1996 | Block et al. ................. 361/719 |
| 5,537,504 A | 7/1996 | Cina et al. |
| 5,546,490 A * | 8/1996 | Kikuchi et al. ............... 385/93 |
| 5,684,903 A * | 11/1997 | Kyomasu et al. ............. 385/93 |
| 5,757,252 A * | 5/1998 | Cho et al. .................... 333/246 |
| 6,123,465 A * | 9/2000 | Hashizume .................. 385/93 |
| 6,302,596 B1 * | 10/2001 | Cohen et al. ................. 385/93 |
| 6,328,483 B1 * | 12/2001 | Havasi et al. ................ 385/92 |
| 6,371,665 B1 * | 4/2002 | Keska et al. ................. 385/93 |
| 6,425,696 B1 * | 7/2002 | Peterson et al. .............. 385/92 |
| 6,432,733 B1 * | 8/2002 | Hashizume .................. 438/22 |
| 6,579,013 B2 * | 6/2003 | Gaio et al. ................... 385/60 |
| 6,646,777 B2 * | 11/2003 | Qin et al. ..................... 359/281 |
| 6,742,938 B2 * | 6/2004 | Tanaka et al. ................ 385/94 |
| 6,762,495 B1 * | 7/2004 | Reyes et al. ................. 257/737 |
| 6,767,140 B2 * | 7/2004 | Pendse et al. ................ 385/89 |

(Continued)

*Primary Examiner*—Jack W Keith
*Assistant Examiner*—Ari M Diacou
(74) *Attorney, Agent, or Firm*—Allen, Dyer, Doppelt Milbrath & Gilchrist, P.A.

(57) ABSTRACT

The present invention relates to an optical sub-assembly, i.e. a receiver optical subassembly or a transmitter optical sub-assembly, for use in an optical transceiver device. The optical sub-assembly according to the present invention includes a hermetic ceramic package with a multi-layer ceramic structure providing a unique RF signal and ground structure providing a controlled signal impedance to achieve high signal transmission quality.

18 Claims, 16 Drawing Sheets

U.S. PATENT DOCUMENTS

| | | | |
|---|---|---|---|
| 6,799,901 B2* | 10/2004 | Yoshimura et al. | 385/88 |
| 6,812,057 B2* | 11/2004 | Tanaka | 438/55 |
| 6,851,870 B1* | 2/2005 | Deng et al. | 385/93 |
| 6,869,231 B2* | 3/2005 | Chiu et al. | 385/93 |
| 6,883,977 B2* | 4/2005 | Dautartas et al. | 385/92 |
| 6,893,166 B2* | 5/2005 | Cheng et al. | 385/88 |
| 6,952,530 B2* | 10/2005 | Helvajian et al. | 398/128 |
| 6,953,290 B2* | 10/2005 | Nakanishi et al. | 385/93 |
| 6,986,611 B1* | 1/2006 | Scruggs et al. | 385/92 |
| 6,991,382 B2* | 1/2006 | Scruggs et al. | 385/92 |
| 6,999,644 B1* | 2/2006 | Lebby et al. | 385/14 |
| 7,036,998 B2* | 5/2006 | Tonai et al. | 385/88 |
| 7,044,654 B2* | 5/2006 | Nakanishi et al. | 385/88 |
| 7,059,780 B2* | 6/2006 | Yamabayashi et al. | 385/88 |
| 7,160,039 B2* | 1/2007 | Hargis et al. | 385/93 |
| 7,322,754 B2* | 1/2008 | Wolf et al. | 385/93 |
| 2002/0057883 A1* | 5/2002 | Malone et al. | 385/136 |
| 2002/0118904 A1* | 8/2002 | Man et al. | 385/11 |
| 2002/0131721 A1* | 9/2002 | Gaio et al. | 385/60 |
| 2002/0196500 A1* | 12/2002 | Cohen et al. | 359/152 |
| 2003/0002825 A1* | 1/2003 | Karker et al. | 385/92 |
| 2003/0063889 A1* | 4/2003 | Lavallee et al. | 385/137 |
| 2003/0077053 A1* | 4/2003 | Panicker et al. | 385/92 |
| 2003/0091304 A1* | 5/2003 | Tonai et al. | 385/93 |
| 2003/0161026 A1* | 8/2003 | Qin et al. | 359/281 |
| 2003/0161363 A1* | 8/2003 | Wolf et al. | 372/34 |
| 2003/0161366 A1* | 8/2003 | Fu et al. | 372/36 |
| 2003/0161588 A1* | 8/2003 | Wolf et al. | 385/88 |
| 2003/0161592 A1* | 8/2003 | Wolf et al. | 385/92 |
| 2003/0161593 A1* | 8/2003 | Stackhouse | 385/92 |
| 2003/0161603 A1* | 8/2003 | Nadeau et al. | 385/137 |
| 2003/0165303 A1* | 9/2003 | Pendse et al. | 385/89 |
| 2004/0105627 A1* | 6/2004 | Hargis et al. | 385/88 |
| 2004/0179562 A1* | 9/2004 | Carroll et al. | 372/36 |
| 2004/0238750 A1* | 12/2004 | Vafi et al. | 250/370.11 |
| 2004/0264883 A1* | 12/2004 | Althaus et al. | 385/88 |
| 2005/0018981 A1* | 1/2005 | Modavis et al. | 385/93 |
| 2005/0047730 A1* | 3/2005 | Ellison | 385/92 |
| 2005/0129372 A1* | 6/2005 | Zheng | 385/94 |
| 2005/0129373 A1* | 6/2005 | Zheng | 385/94 |
| 2005/0175299 A1* | 8/2005 | Hargis et al. | 385/93 |
| 2005/0238289 A1* | 10/2005 | Shull et al. | 385/53 |
| 2005/0244111 A1* | 11/2005 | Wolf et al. | 385/93 |

* cited by examiner

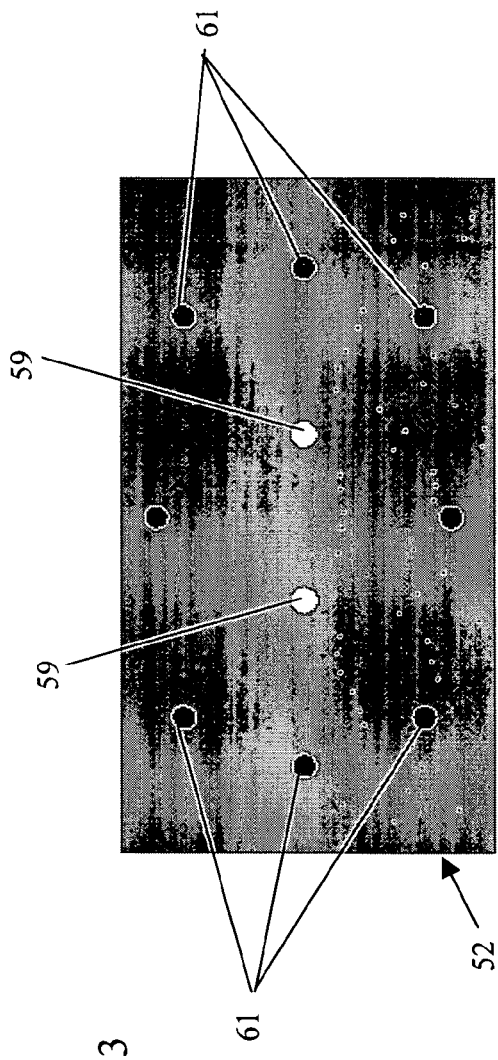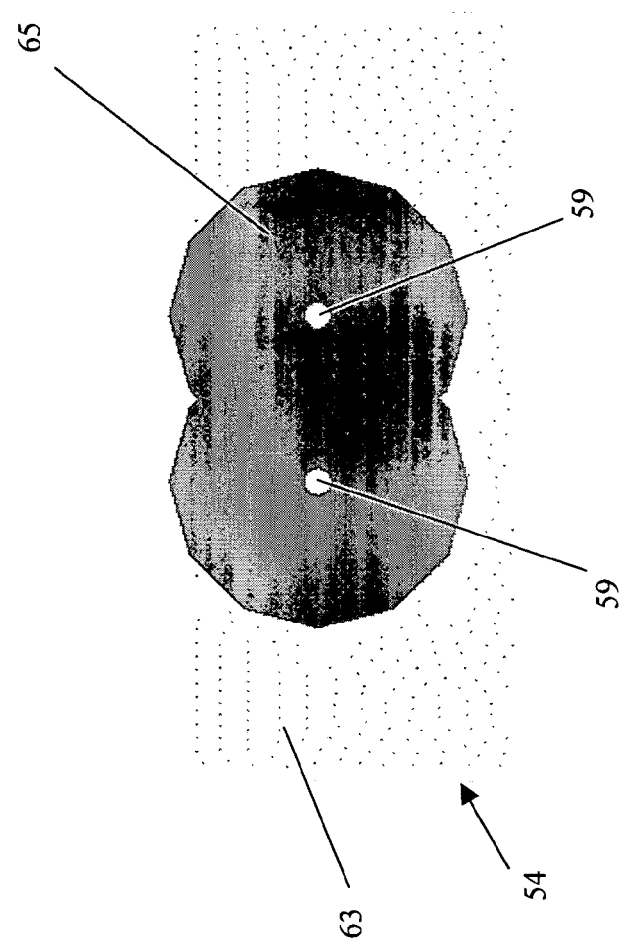
Figure 13
Figure 14

COMPACT OPTICAL SUB-ASSEMBLY WITH CERAMIC PACKAGE

CROSS-REFERENCE TO RELATED APPLICATIONS

The present invention claims priority from U.S. Patent Application No. 60/541,076 filed Feb. 2, 2004, which is incorporated herein by reference.

TECHNICAL FIELD

The present invention relates to an optical sub-assembly (OSA) for use in an optical transceiver, and in particular to a compact OSA including a ceramic package for transmitting or receiving high data transfer rate signals.

BACKGROUND OF THE INVENTION

The driving forces in the transceiver manufacturing industry are reducing the form factor sizes, increasing the data transfer rates, and decreasing the costs. To achieve all of these goals, the conventional transistor outline (TO) can design approach must be replaced with a more exotic component packaging approach. However, to provide an OSA that can be used over a wide range of data transfer rates and products, the OSA must use controlled impedance connections for the high speed RF electrical signal path between the OSA chip and the transceiver electronics. Moreover, the total number of component parts must be reduced, and manufacturable from readily available materials. The assembly processes, including optical alignment, must be simplified and/or automated to reduce labor costs and increase production rates, and the fiber receptacle components should support a variety of wavelengths.

Conventional OSA designs, such as the one disclosed in U.S. Pat. No. 5,537,504, issued Jul. 16, 1996 to Cina et al and assigned to the present Applicant, include a opto-electronic (O/E) transducer 4 mounted in a container 25, which is sealed by a window 26. Solid metallic leads 23 and 24 extend through the rear of the container 25 for soldering to other electrical leads or directly to a transceiver PCB. The Cina et al device will suffer from poor signal integrity at high data transfer rates, because the RF signals need to transmit through the leads 23 and 24, which limits the quality of the transmission and the positioning of the transceiver PCB. The use of flexible-tape conductive wiring has been disclosed in U.S. Pat. No. 5,005,939 issued Apr. 9, 1991 to Arvanitakis et al and assigned to the present Applicant, but only for connecting the existing leads of an OSA to the transceiver PCB. Moreover, the Arvanitakis et al device does not disclose the use of controlled signal impedance conductors required for high-quality high-data rate signals.

An object of the present invention is to overcome the shortcomings of the prior art by providing an optical sub-assembly with a controlled signal impedance between the transducer chip and the transceiver PCB.

SUMMARY OF THE INVENTION

Accordingly, the present invention relates to an optical sub-assembly comprising:

an optical connector defining a longitudinal optical axis for receiving an end of an optical fiber, which transmits a beam of light including an optical signal;

a housing coupled to the optical connector;

a multi-layer ceramic package including ground and signal via structures for transmitting RF signals with controlled signal impedance therethrough;

a transducer mounted in the ceramic package for converting the optical signal into an electrical signal or for converting an electrical signal into the optical signal;

a lens defining a lens axis mounted in the housing for relaying the beam of light between the optical fiber and the transducer; and a flexible circuit conductor including a ground layer and a signal layer providing controlled impedance transmission lines for transmitting the electrical signal to or from the transducer, one end of which is supported by the ceramic package and electrically connected to the transducer, the other end of which extends outwardly for connection with control electronics of a host device.

BRIEF DESCRIPTION OF THE DRAWINGS

The invention will be described in greater detail with reference to the accompanying drawings which represent preferred embodiments thereof, wherein:

FIG. 13 is a top view of a portion of the ceramic package of FIGS. 4 and 5 illustrating an alternative embodiment of the RF signal vias surrounded by ground vias;

FIG. 14 is a top view of a portion of the first or second internal wiring layer illustrating the alternative embodiment of the RF signal vias from FIG. 9;

DETAILED DESCRIPTION

Figure 1:
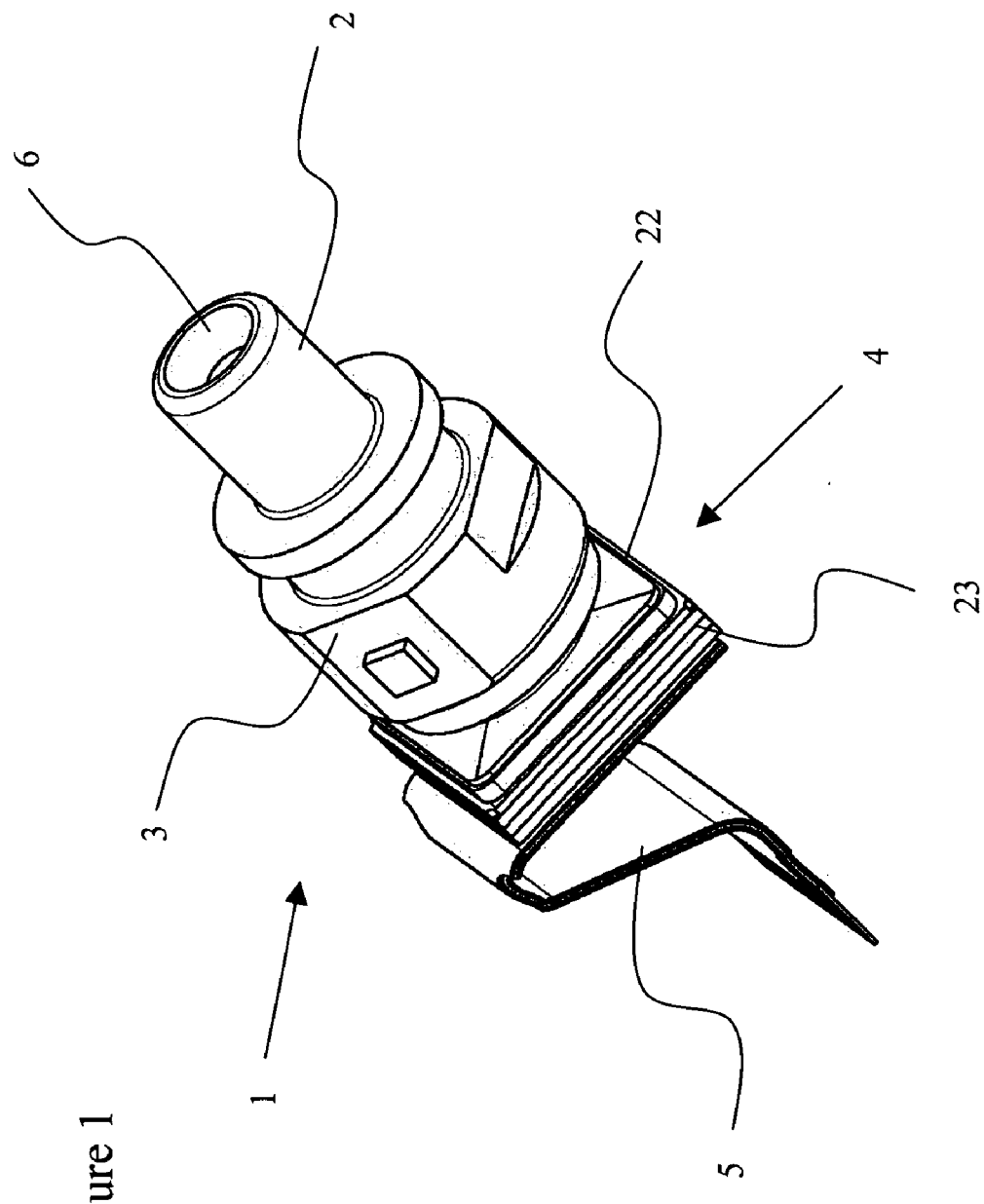
FIG. 1 is an isometric view of an OSA according to the present invention.
Figure 2:
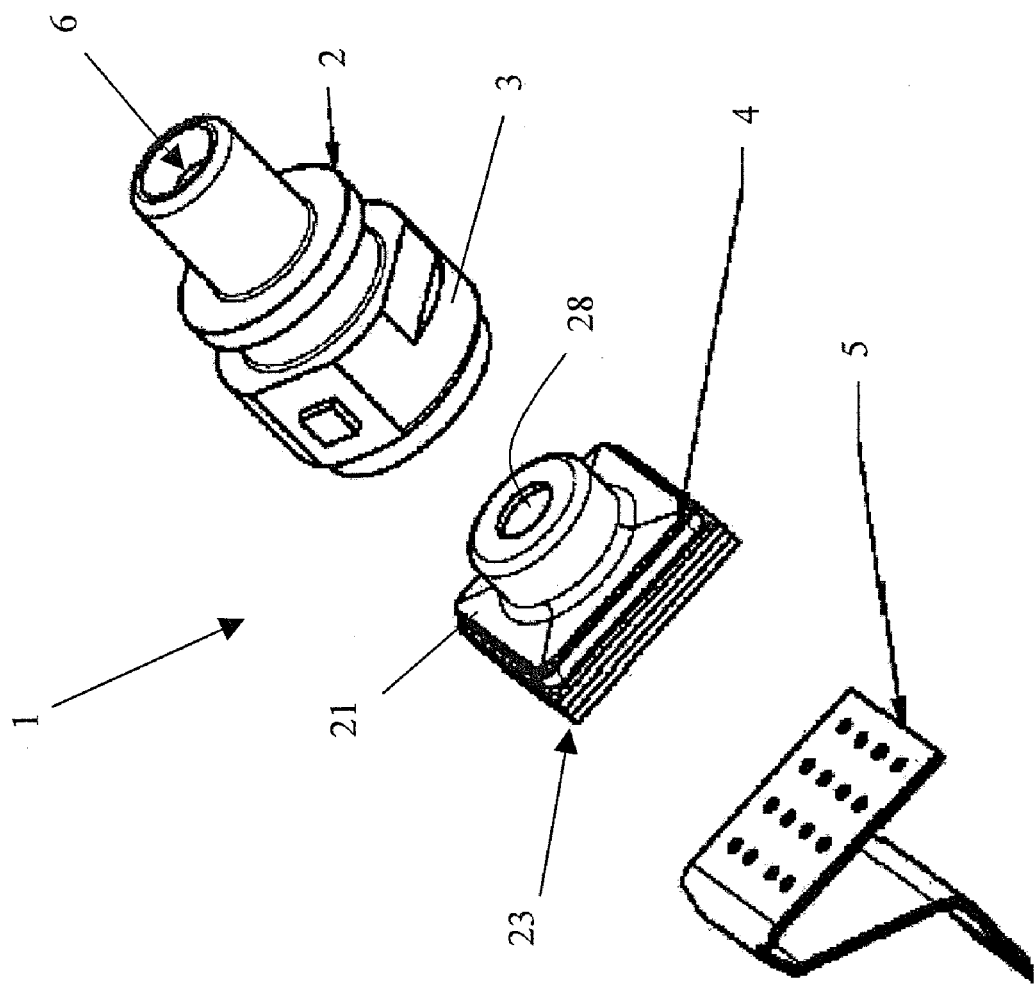
FIG. 2 is an exploded isometric view of the OSA of FIG. 1.
Figure 3:
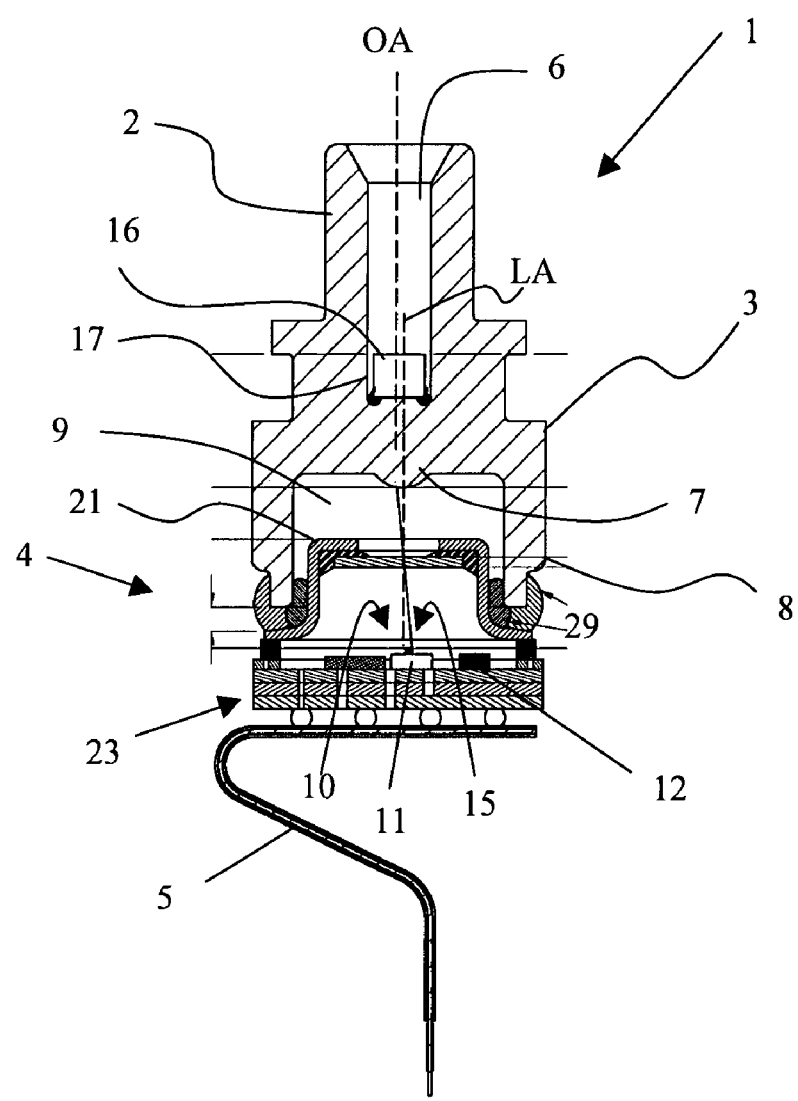
FIG. 3 is a cross-sectional view of the OSA of FIGS. 1 and 2.

With reference to FIGS. 1 to 3, an OSA according to the present invention, generally indicated at 1, includes an optical coupler 2, a housing 3, a ceramic package 4, and a flexible circuit 5. The optical coupler 2 includes an optical bore 6, defining a longitudinal optical axis OA, for receiving an end of an optical fiber (not shown), which transmits a beam of light including an optical signal to or from the OSA 1. The housing 3 includes a lens 7 for relaying the beam of light between the optical fiber and the ceramic package 4, and an annular mounting flange 8 defining an enclosure 9. Preferably, the optical coupler 2 and the housing 3 are integrally molded from an optical grade plastic, e.g. ULTEM1010.

The OSA 1 could be either a receiver optical sub-assembly (ROSA) with an opto-electronic (OE) transducer 10, for converting optical signals into electrical signals or a transmitter optical sub-assembly (TOSA) with an OE transducer 10, for converting electrical signals into optical signals. For a ROSA, the OE transducer 10 includes a photo-detector 11 with a trans-impedance amplifier (TIA) 12 connected thereto. For a TOSA, the OE transducer 10 includes a light source, e.g. a vertical cavity surface emitting laser (VCSEL), with a laser driver connected thereto.

For ROSA applications, the lens axis LA is offset radially with respect to the longitudinal optical axis OA, so that the light exiting the fiber, depicted by chief ray 15, will be tilted, i.e. a small acute angle of 3° to 10°, relative to the longitudinal optical axis OA. Accordingly, the light will be incident on the photo-detector 11 at an angle of between 80° and 87°, i.e. 3° to 10° from normal, which will reduce the amount of back reflection from the photo-detector 11 to the fiber without physically tilting the photo-detector 11.

To further limit back reflections as the beam of light exits the optical fiber, an index-matching optical insert 16 is mounted on a front surface of the lens 7. The optical insert 16 has an index of refraction closely matching that of the optical fiber. Preferably, the optical insert 16 is a rectangular or cylindrical block of silica, BK7, or Borosilicate float glass. Ideally an index-matching adhesive, preferably having an index of refraction midway between the index of refraction of the optical insert 16 and the index of refraction of the lens 7, is used to fix the optical insert 16 to the front surface of the lens 7. Alternatively, the optical insert 16 can be mounted to the front surface of the lens 7 by some other means, such as press fitting.

In a preferred embodiment, the optical insert 16 projects outwardly into the bore 6 of the optical connector 2 forming a trough 17 therearound. The trough 17 will provide an area for collecting any dust or foreign particles entering the bore 6 to prevent this material from being embedded into the optical insert 16.

Since the optical fiber is silica based, the reflection at the optical fiber/optical insert 16 interface is negligible. The difference in refractive index at the optical insert 16/plastic lens 7 interface does result in a small amount of back reflection. However, the beam of light expands prior to hitting the front surface of the lens 7, and continues to expand as it is reflected back to the optical fiber. Accordingly, the overlap between the back reflected light and the optical fiber mode is relatively small, i.e. only a small fraction of the beam of light is reflected back to the optical fiber. To reduce the back reflection even further, the size of the optical insert 16 can be increased beyond the usual 0.8 mm length.

Figure 4:
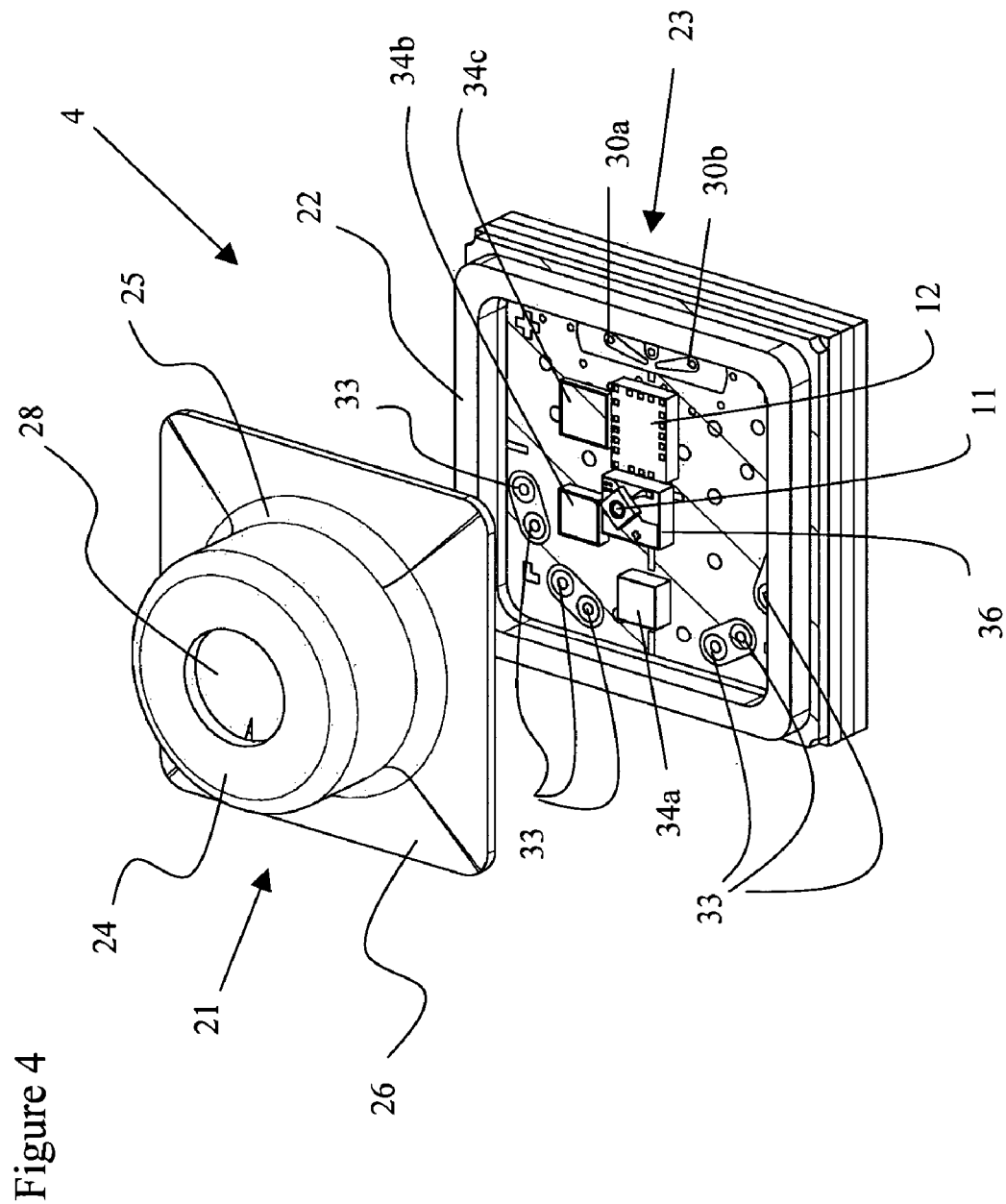
FIG. 4 is an exploded isometric view of a ceramic package and cap for the OSA of FIGS. 1 to 3.
Figure 5:
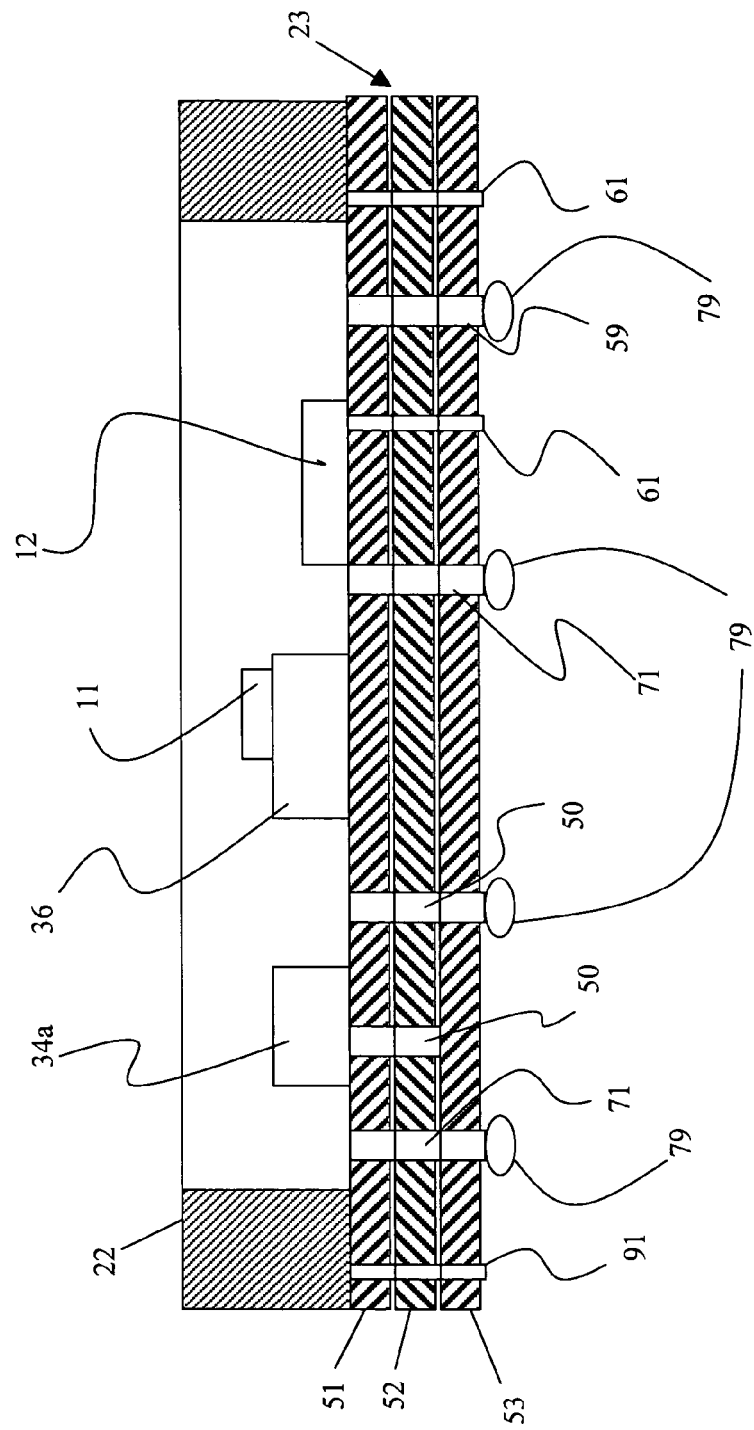
FIG. 5 is a cross-sectional view of the ceramic package of FIG. 4.
Figure 6B:
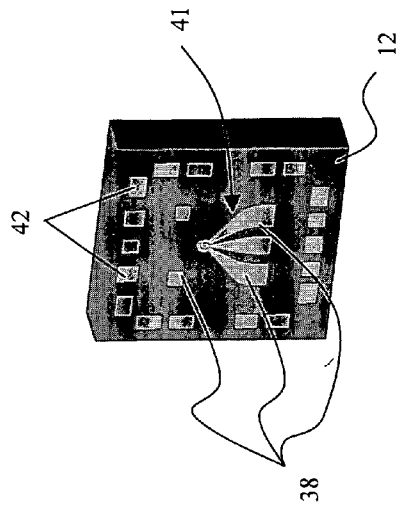
FIGS. 6*a* to 6*d* are isometric views of an embodiment of a photo-detector and transimpedance amplifier for use in the OSA of FIGS. 1 to 5.
Figure 6D:
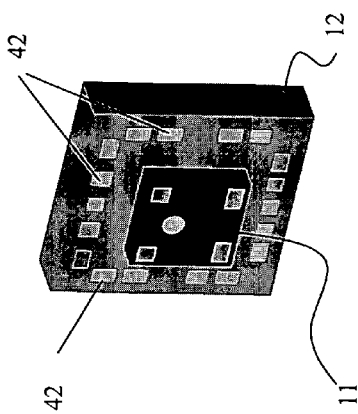
Figure 6A:
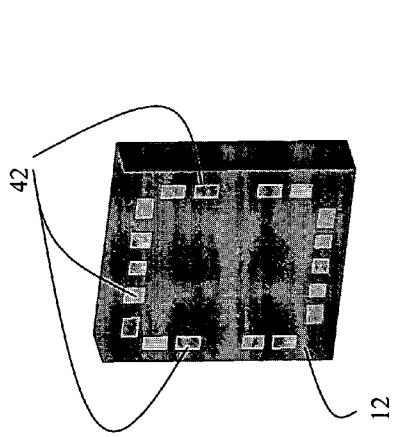
Figure 6C:
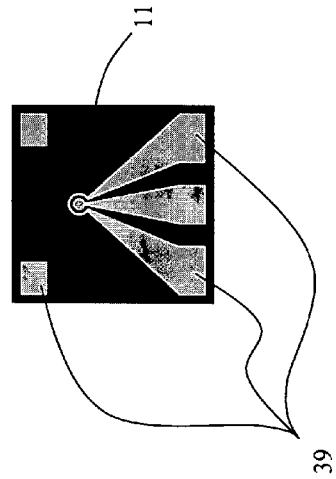
Figure 7:
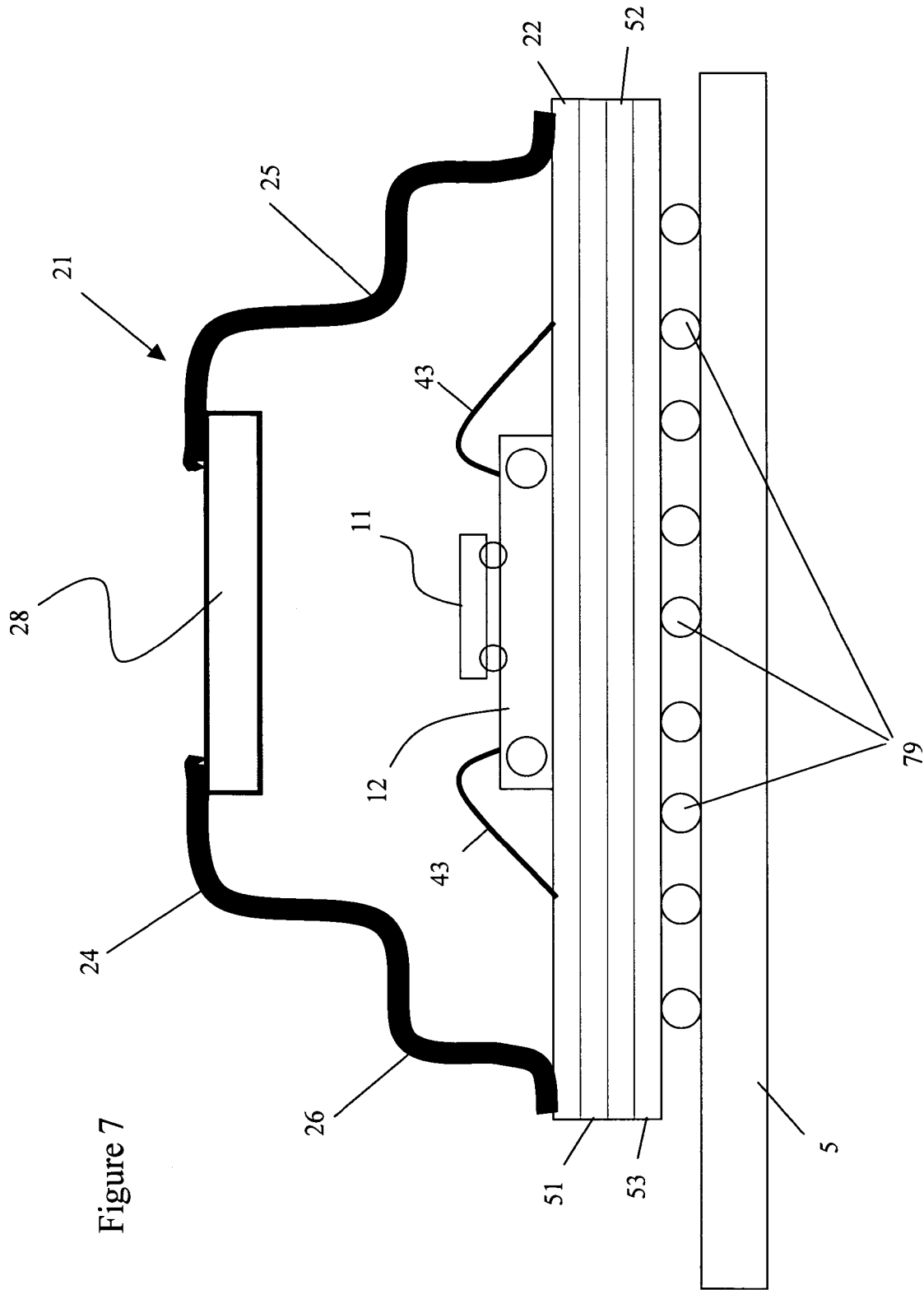
FIG. 7 is a cross-sectional view of an alternative embodiment of the ceramic package of the present invention.

With reference to FIGS. 4 and 5, the ceramic package 4 is comprised of a transitional cap 21, a sealing spacer ring 22, and a multi-layer ceramic structure 23. For manufacturing convenience, the ceramic structure is usually square or rectangular. Accordingly, the transitional cap 21 includes a cylindrical upper portion 24 for extending into the enclosure 9, a transitional middle portion 25, and a square (or rectangular) base portion 26 for covering the multi-layer ceramic structure 23. A hermetically sealed window 28 is mounted in the upper portion 24 enabling the beam of light to travel between the lens 7 and the transducer 10. Preferably, the sealing spacer ring 22 is comprised of a material with a low coefficient of thermal expansion, e.g. Kovar, which is welded to the upper portion 24 and brazed to metallurgy on the ceramic structure 23 to ensure a hermetic seal, necessary for certain applications, e.g. avalanche photodiodes (APD) with high voltage bias. The ceramic package 4 is fixed to the housing 3 by an adhesive 29, which is applied between the mounting flange 8 and the transition and base portions 25 and 26, respectively.

Along with the transducer 10, e.g. the photo-detector 11 and the TIA 12, the upper surface of the ceramic structure 23 includes solder pads 30a and 30b or wire bond pads (not shown) for connecting RF signal transmission lines, respectively, to the TIA 12 (or the laser driver). Eight redundant control pads 33 are provided for connecting other electrical components and transmitting signals for other functions, e.g. power and optical power monitoring Other electrical components 34a to 34c can be positioned proximate the transducer 10, e.g. thermistors 34a for monitoring temperature, capacitors 34b and 34c used in low pass filters for the TIA 12, and inductive choke components, which enable DC current to be fed to a laser without a reduction in the AC RF signal.

The photo-detector 11, illustrated in FIGS. 4 and 5, is mounted ("flip chip") on a submount 36, such that the light enters through the substrate, i.e. rear illuminated; however, other arrangements, such as front illuminated photo-detectors, are possible. The illustrated TIA 12 is positioned adjacent to the photo-detector 11 to enable direct wire bonding of the photo-detector connections to the TIA input pads, thereby enabling the wire bonds to be kept short to limit wire bond inductance, and enabling the length of the wire bonds to be adjusted to vary the inductance thereof for multiple TIA input requirements.

Alternatively, with reference to FIGS. 6a to 6d and 7, the photo-detector 11 can be a rear-illuminated reverse-biased photodiode, which responds to an incident optical signal by generating a current with both an AC and a DC component. Electrical contacts 38 on a mounting surface of the TIA 12 are connected to corresponding electrodes 39 on the photo-detector 11 using any one of many known methods, such as the use of solder bumps in a flip chip bonding process. Preferably a redistribution layer 41, with the pre-amplifier contacts 38, is preferably added to the TIA 12 after initial processing to match the electrical contacts 39 on the photo-detector 11. The flip chip bonding process provides very low package parasitics, while enabling the photo-detector 11 to be aligned with high precision. Alternatively, a wiring layout with contacts 38 can be added to the metallurgy of the TIA 12 during initial processing; however, this method precludes the TIA 12 from being used with standard wire bonds, as well. Contacts 42 are provided around the periphery of the TIA 12 for connecting wire bonds 43 to the appropriate connections on the surface of the ceramic structure 23.

A front-illuminated photo-detector could also be mounted on a TIA chip, in which top-side contact pads on the photodiode substrate connect to pads on the TIA. Newly developed front-illuminated photodiodes bring the substrate contact to the top surface of the photodiode, so that both contacts (Anode and Cathode) can be made with wire bonds.

As illustrated in FIGS. 5 to 10, the ceramic structure 23 includes first, second and third ceramic layers 51, 52 and 53, respectively, with first and second internal wiring layers 54 and 55 sandwiched therebetween. One side of the ceramic structure 23 includes vertically extending vias 50 extending from the eight redundant control pads 33 on the surface of the first ceramic layer 51 to one of four bottom control pads 56 on the bottom of the third ceramic layer 53 forming control lines for voltage power, APD bias voltage, temperature output, laser bias, laser temperature, monitor photodiode anode, monitor photodiode cathode, and optical power monitoring etc. The first internal wiring layer 54 (FIG. 9) includes laterally extending conductors 57 for connecting one, two or three of the vias 50 extending through the first ceramic layer 51 to a single via 50 extending through the second ceramic layer 52, thereby providing redundant control pads, e.g. 33, on the upper surface of the first ceramic layer 51 connected to the bottom control pads 56. The redundancy enables a variety of TIA 12 chips, having various input/output pad layouts to be configured to the same bottom control pad configuration, i.e. the same input/output configuration for the flexible circuit 5 and the host transceiver PCB. As a consequence, some of the vias 50 do not extend through all three of the ceramic layers 51, 52 and 53, see FIG. 5.

Figure 11:
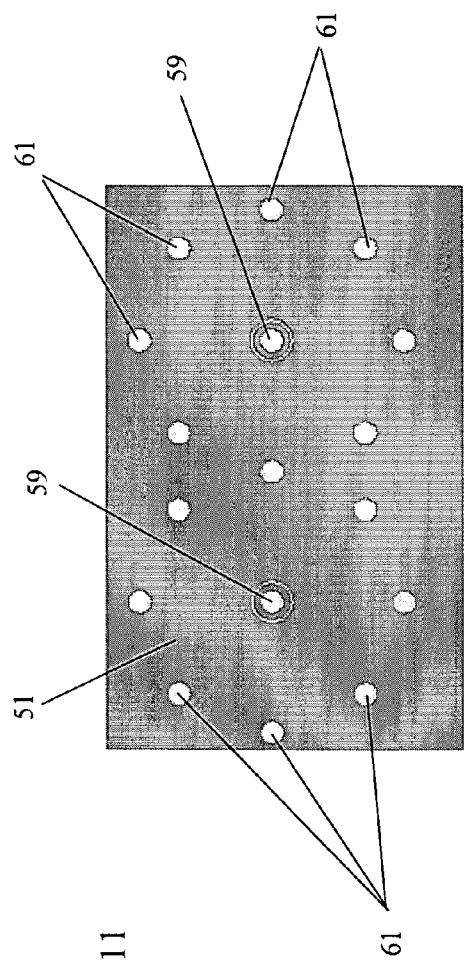
FIG. 11 is a top view of a portion of the ceramic package of FIGS. 4 and 5 illustrating the RF signal vias surrounded by ground vias.
Figure 12:
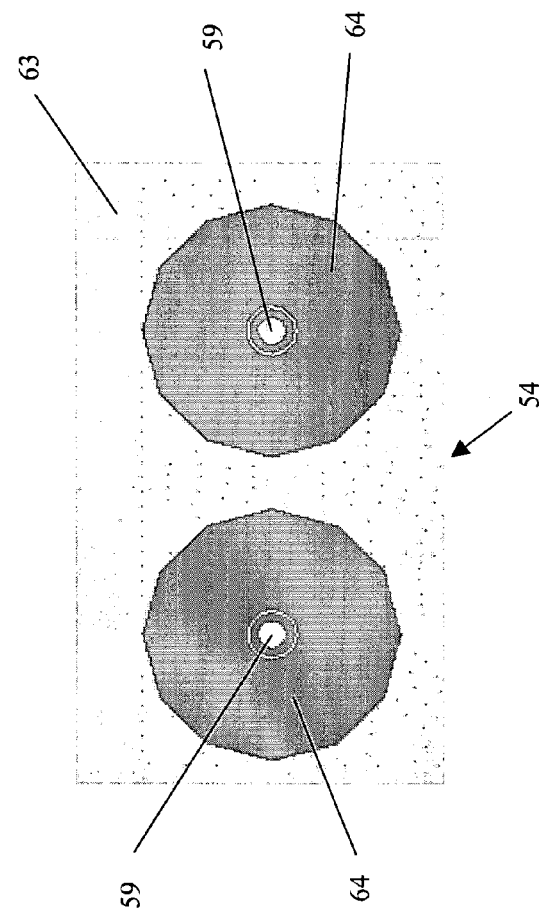
FIG. 12 is a top view of a portion of the first or second internal wiring layer illustrating the RF signal vias.

The other side of the ceramic structure 23 includes first and second RF signal vias 59 extending perpendicularly through the first, second and third ceramic layers 51, 52 and 53, respectively, from the solder pads 30a and 30b to solder pads 60a and 60b on the bottom surface of the third ceramic layer 53. The first and second RF signal vias 59 are substantially surrounded by a plurality of ground vias 61 providing a controlled signal impedance to achieve high signal transmission quality through the ceramic structure 23. With reference to FIGS. 11 and 12, a first embodiment is illustrated in which the ground vias 61 isolate the RF signal vias 59 from each other, i.e. the RF signal vias are uncoupled, by encircling each RF signal via 59, and ensuring at least one of the ground vias 61 is positioned therebetween, e.g. the ground vias 61 form a figure-8 configuration. Each RF signal via 59 is in the center of a ring of equally spaced apart ground vias 61, i.e. a ring of ground vias 61 is coaxial with the RF signal via 59. The spacing of the ground vias 61 from the RF signal vias 59, which is equal for all ground vias 61, is determined based on the required amount of impedance, e.g. 50 ohms. Each of the first and second internal wiring layers 54 and 55, respectively, see FIGS. 9, 10 and 12, include a metal ground plane 63 with separate holes 64 for each RF signal via 51 cut out therefrom. The holes 64 have diameters somewhat smaller than the diameters of the ring of ground vias 61, so that the ground vias 61 can extend through the metal ground plane 63.

In an alternative embodiment illustrated in FIGS. 13 and 14, the ground vias 61 surround the first and second RF signal vias 59, whose signals are coupled together through electromagnetic interaction. Again, the spacing between the RF signal vias 59 and the ground vias 61 is selected to provide a desired impedance, e.g. 100 ohms. In this embodiment a single hole 65 would be cut out of the first and second internal wiring layers 54 and 55 to accommodate the RF signal vias 59. The hole 65 is substantially oval, elliptical or rectangular with rounded ends.

In both of the aforementioned embodiments the desired impedance is determined based not only the spacing of the ground vias 61, but also on the cross-section and spacing of the holes 64 or 65 in the first and second internal wiring layers 54 and 55, which couple the ground vias 61 together and form part of the grounding structure.

Figure 8:
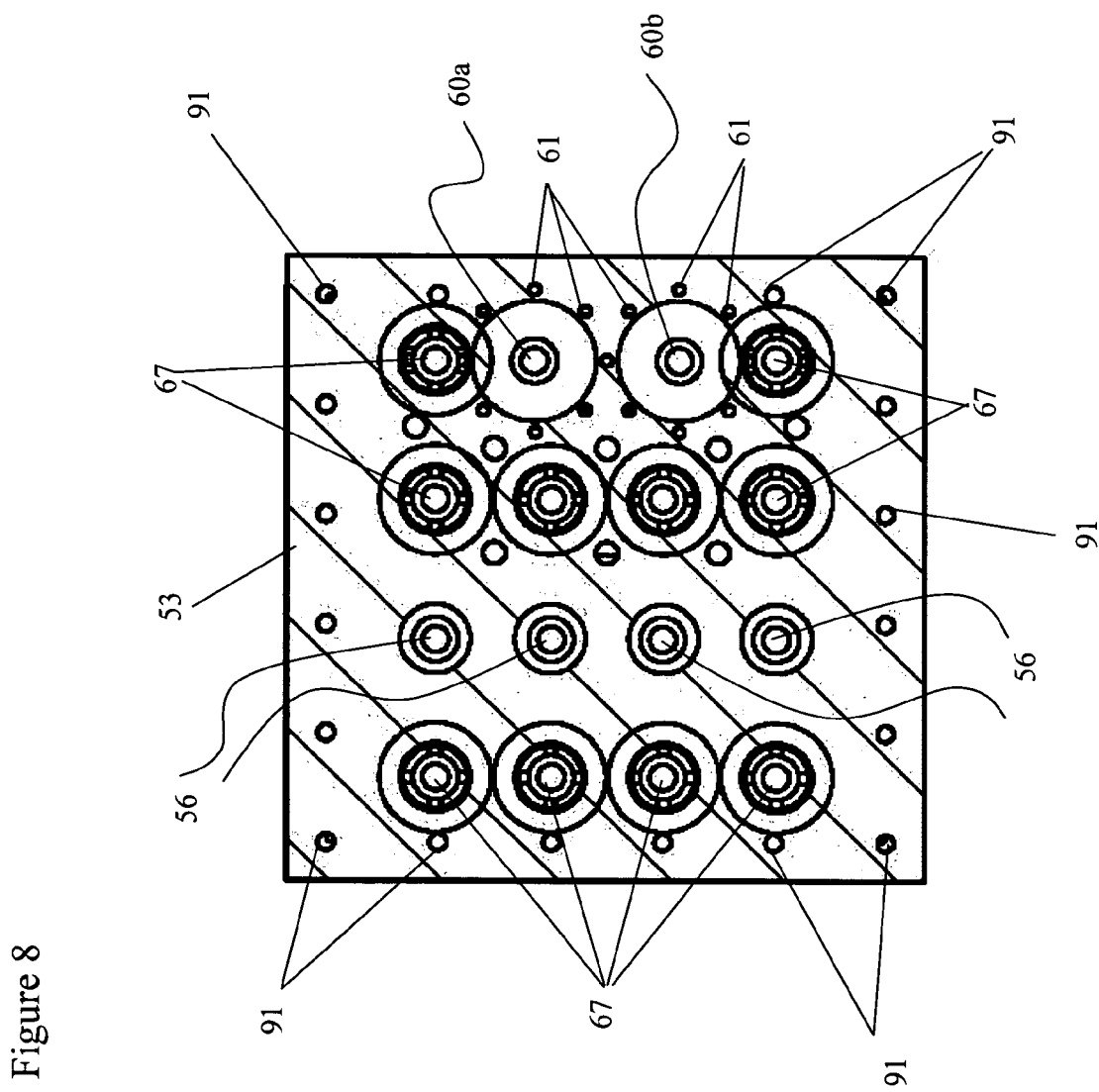
FIG. 8 is a bottom view of the ceramic package of FIGS. 4 and 5.

The remaining connection pads 67 on the bottom surface of the third ceramic layer 53, see FIG. 8, provide connections for ground vias 71 for use in combination with the control line vias 50. Alternatively, many of the connection pads 67, which do not get connected to a ground via 71, provide a dummy connection means by which the flexible circuit 5 can be fixed to the third ceramic layer 53, so that the live connections are not subjected to the majority of any stresses between the OSA 1 and the transceiver PCB.

Figure 15:
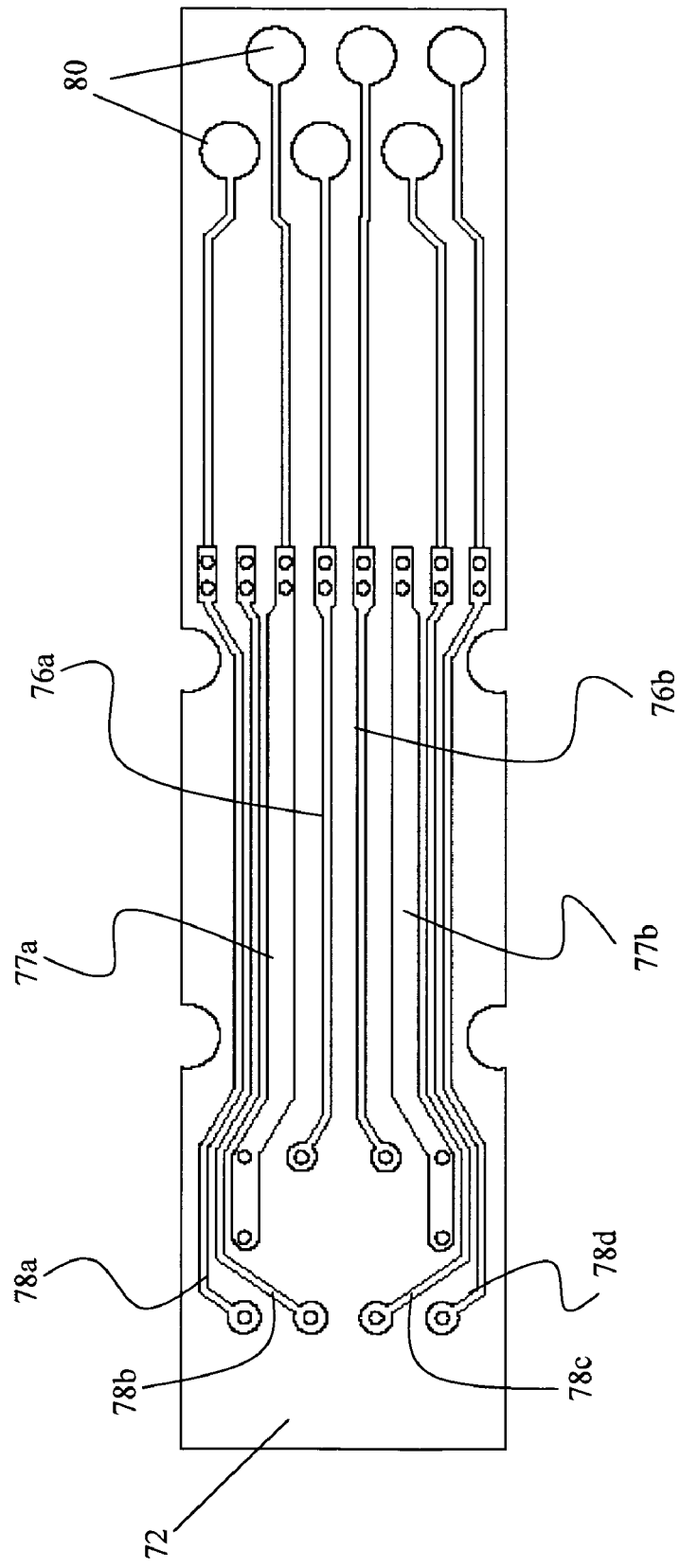
FIG. 15 is a top view of a flexible circuit signal layer.
Figure 16:
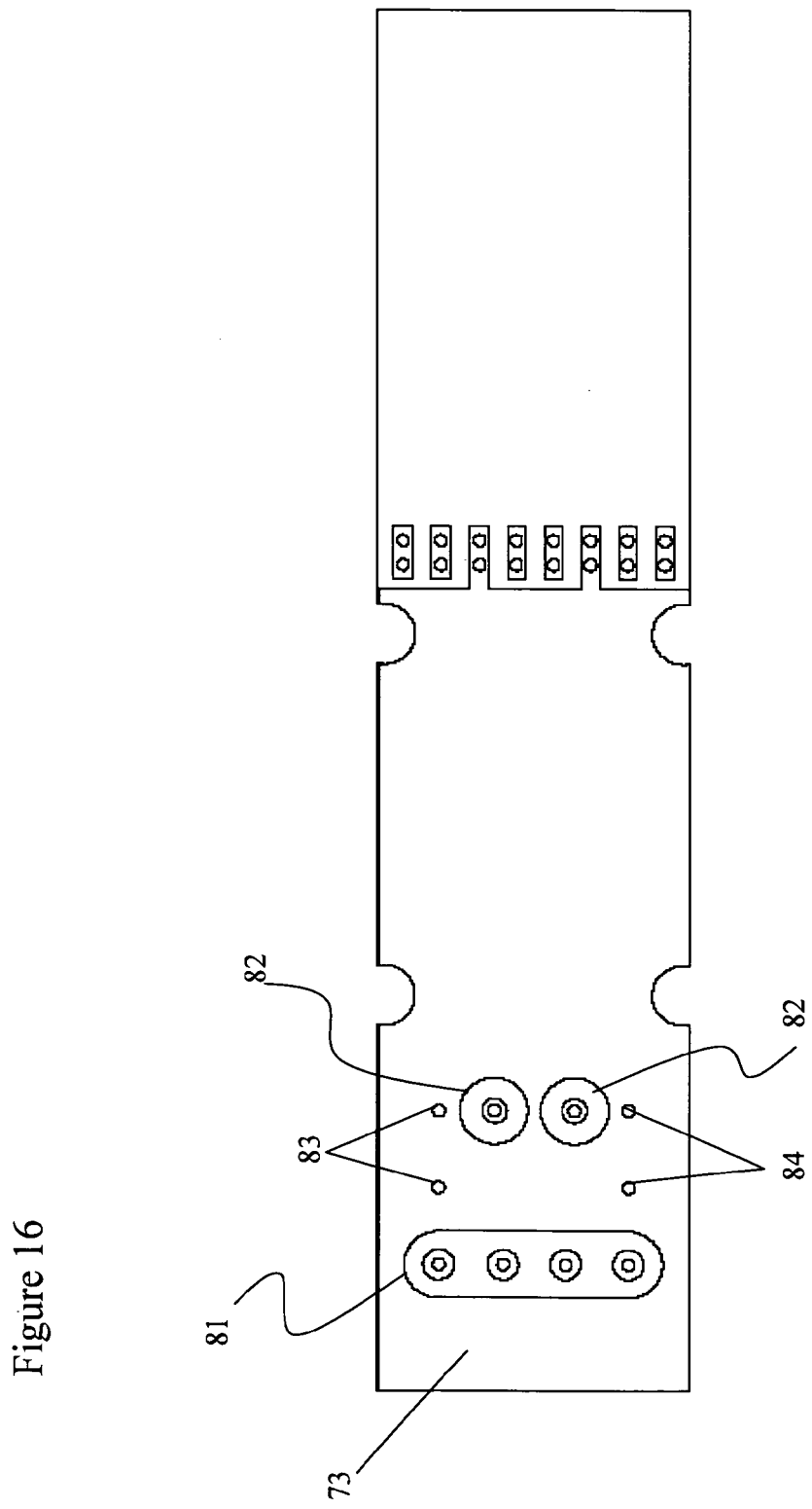
FIG. 16 is a top view of a flexible circuit ground layer.
Figure 17:
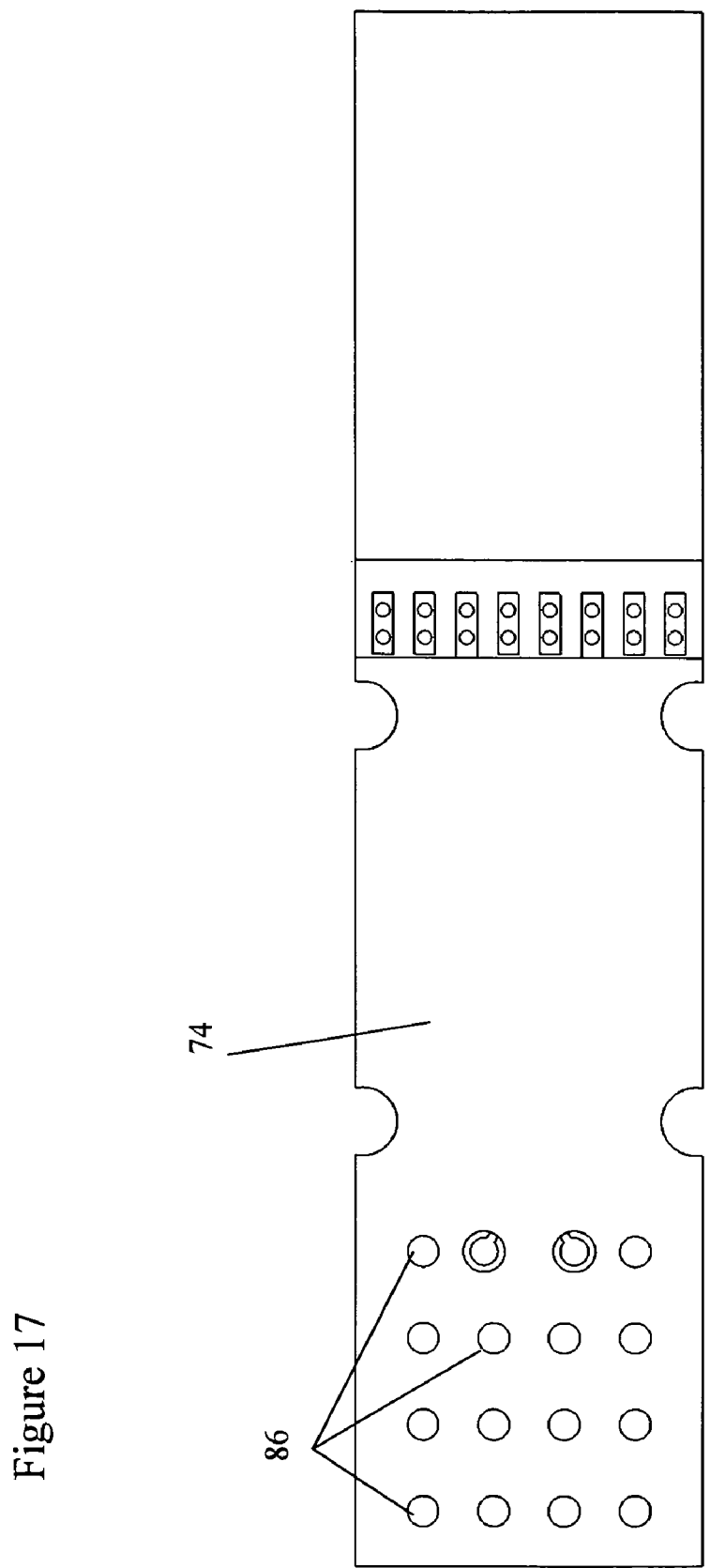
FIG. 17 is a top view of a flexible circuit mask layer.

The layers of the flexible circuit 5 are illustrated in FIGS. 15, 16 and 17, and include a signal layer 72 (FIG. 15), a ground layer 73 (FIG. 16), and a mask layer 74 (FIG. 17). The signal layer 72 includes two RF data signal transmission lines 76a and 76b, two ground lines 77a and 77b, and four control lines 78a to 78d. One end of the RF data signal transmission lines 76a and 76b is connected to one of the RF data signal pads 60a and 60b, respectively, using BGA solder balls 79 or other suitable means. Similarly, solder balls 79 or other suitable means are used to connect one end of the control lines 78a to 78d to the bottom control pads 56, while one end of the ground lines 77a and 77b is connected to ground connection pads 67. The other ends of the lines 76a, 76b, 77a, 77b, and 78a to 78d include solder pads for connection to the transceiver PCB. Originally the signal layer 72 includes test pads 80, which are cut off after assembly. The ground layer 73 includes openings 81 for the control line vias, as well as openings 82 for the RF data signal vias. The ground lines 77a and 77b are connected to the ground layer 73 at points 83 and 84, respectively. The mask layer 74 provides a solder mask or cover for the copper ground layer 73, and includes sixteen openings 88 enabling access to the sixteen solder pads on the bottom of the third ceramic layer 53 (FIG. 8).

Figure 9:
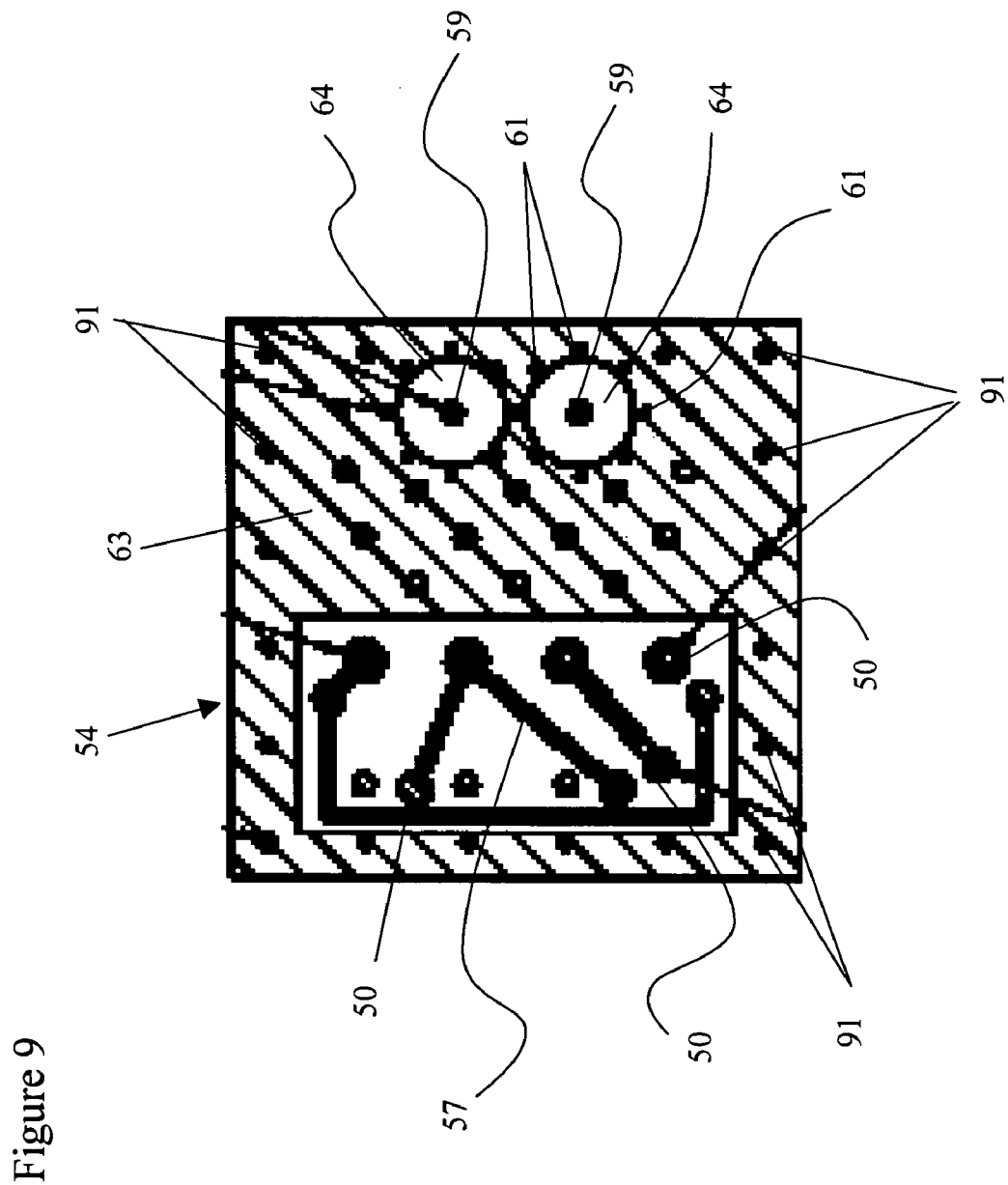
FIG. 9 is a top view of a first internal wiring layer of the ceramic package of FIGS. 4 and 5.
Figure 10:
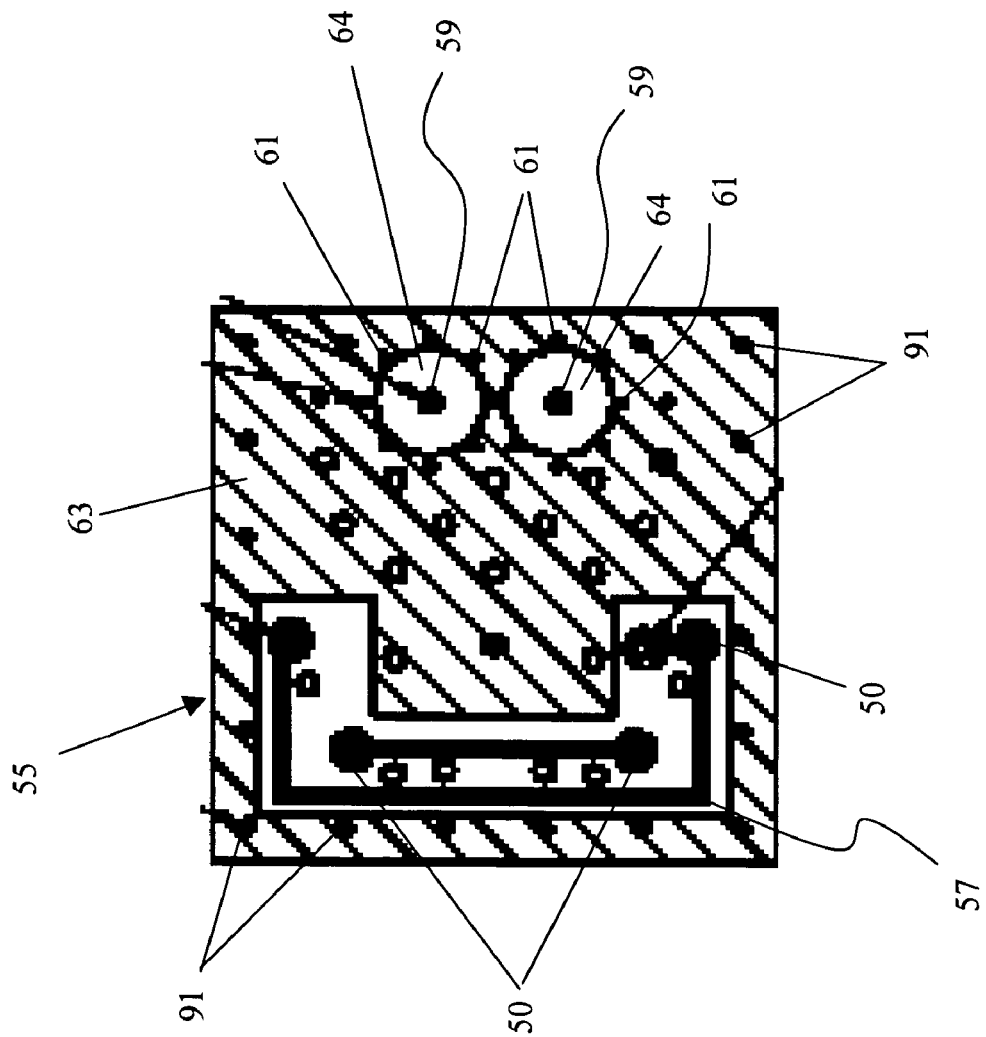
FIG. 10 is a top view of a second internal wiring layer of the ceramic package of FIGS. 4 and 5.

With reference to FIGS. 8, 9 and 10, a plurality of shielding ground vias 91 are positioned around the periphery of the ceramic structure 23. The shielding ground vias 91 extend from the ground layer 73 of the flexible circuit 5 through each of the first, second and third ceramic layers 51, 52 and 53, as well as the ground planes 63 of the first and second internal wiring layers 54 and 55. The shielding ground vias 91 are connected to the sealing spacer ring 22, to which the metal transitional cap 21 is welded, and are spaced apart by about ¼ wavelength, which is small enough to block unwanted electromagnetic interference (EMI). Accordingly, the transitional cap 21, the sealing spacer ring 22, the shielding ground vias 91, and a ground plane of the flexible circuit 5 form a "Faraday Cage" to shield the OSA 1 from unwanted EMI.

Moreover, the combination of the ground vias 61, 71 and 91, DC and RF vias 50 and 59, sealing spacer ring 22, transitional cap 21, solder balls 79, and traces on the flexible circuit 5 dissipate the internal heat load from the TIA 12 to provide better performance over a required temperature range.

Figure 18:
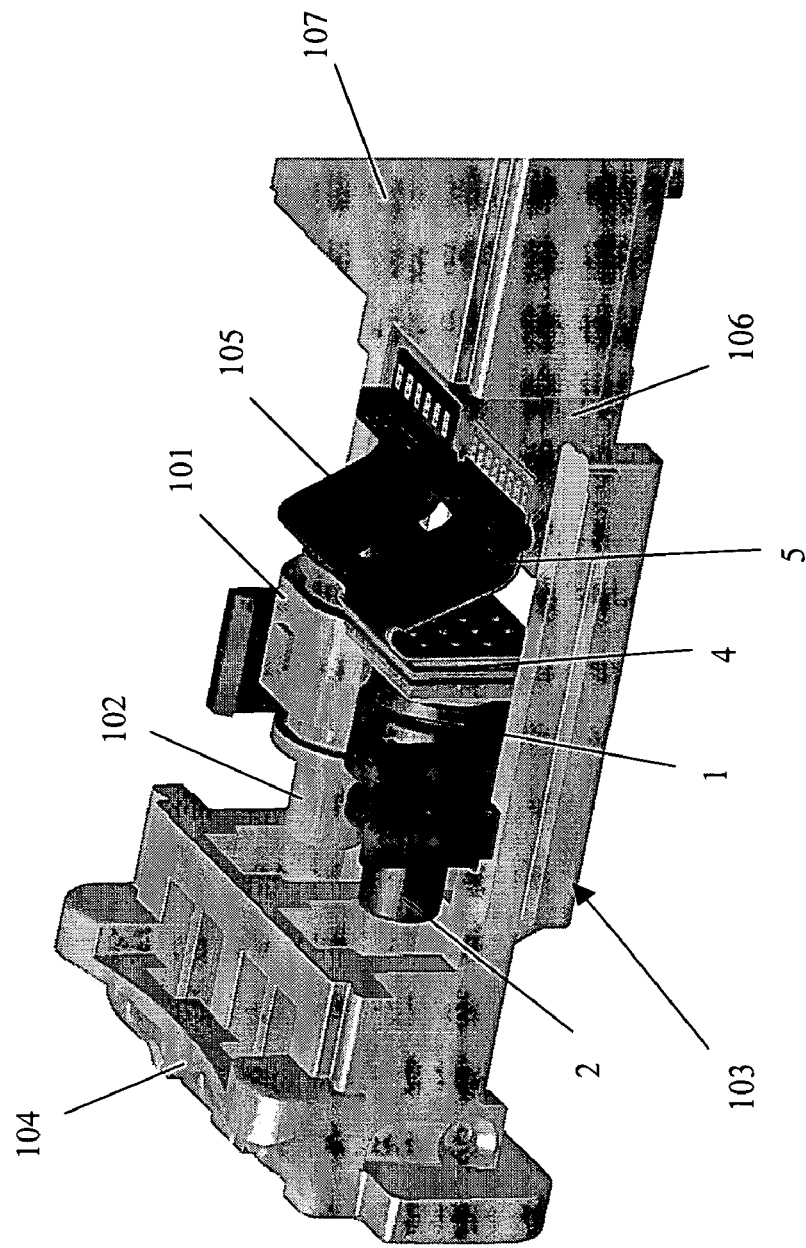
FIG. 18 is an isometric view of the OSA according to the present invention mounted in a transceiver.

With reference to FIG. 18, the OSA 1 is best suited for use as a ROSA, which is mounted beside a TOSA 101 in a transceiver housing 103, the TOSA being capable of transmitting at 10 gigabits er second. A duplex optical connector 104 is provided in the front on the housing 103 adapted to receive a corresponding duplex optical connector, fixed on the end of a pair of optical fibers, which extend into the optical couplers 2 and 102 of the ROSA 1 and TOSA 101, respectively. The TOSA 101 is a flex ring TOSA, as disclosed in copending U.S. Patent Application 60/539,219 filed Jan. 26, 2004, which is incorporated herein by reference, and includes a flexible circuit conductor 105 extending to a PCB 106. As above, the OSA 1 includes a ceramic package 4 with a flexible circuit 5 extending therefrom to the PCB 106. The rear end 107 of the housing 103 includes an electrical connector, e.g. a PCB edge connector or pins, for electrically connecting the transceiver to a host device.

We claim:

1. An optical sub-assembly comprising:
an optical coupler for receiving an end of an optical fiber, which transmits a beam of light including an optical signal;

a housing coupled to the optical coupler;

a multi-layer ceramic package mounted on the housing and including ground and signal vias for transmitting first and second RF electrical signals with a specific RF signal impedance therethrough, the multilayer ceramic package comprising a plurality of ceramic layers and an internal wiring layer positioned between adjacent ones of the ceramic layers to transmit control signals laterally;

a transducer mounted on the multi-layer ceramic package for converting the optical signal into the first and second RF electrical signals or for converting the first and second RF electrical signals into the optical signal;

a lens mounted in the housing for relaying the beam of light between the optical fiber and transducer; and a multi-layer flexible circuit comprising a plurality of stacked layers including a ground layer and a signal layer providing transmission lines for transmitting the first and second RF electrical signals between the transducer and control electronics of a host device, one end of the multi-layer flexible circuit being supported by the multi-layer ceramic package and electrically connected to the transducer, the other end of the multilayer flexible circuit extending outwardly for connection with the control electronics of the host device;

wherein the signal vias of the multi-layer ceramic package include first and second RF vias for transmitting the first and second RF signals and being surrounded by the ground vias at a distance providing the specific signal impedance.

2. The optical sub-assembly according to claim 1, wherein the first and second RF vias have a ground via therebetween, thereby isolating the first and second RF signals from each other.

3. The optical subassembly according to claim 2, wherein each of the first and second RF vias is in the center of a plurality of equally spaced ground vias.

4. The optical sub-assembly according to claim 1, wherein the ground vias are arranged in a substantially oval shape around the first and second RF vias, whereby the first and second RF signals are coupled.

5. An optical sub-assembly comprising:

an optical coupler defining a longitudinal optical axis for receiving an end of an optical fiber, which transmits a beam of light including an optical signal;

a housing coupled to the optical coupler;

a multi-layer ceramic package mounted on the housing and including ground and signal vias for transmitting first and second RF electrical signals with a specific RF signal impedance therethrough, the multi-layer ceramic package comprising a plurality of ceramic layers and an internal wiring layer positioned between adjacent ones of the ceramic layers to transmit control signals laterally;

a transducer mounted on the multi-layer ceramic package for converting the optical signal into the first and second RF electrical signals or for converting the first and second RF electrical signals into the optical signal;

a lens defining a lens axis mounted in the housing for relaying the beam of light between the optical fiber and the transducer; and a multi-layer flexible circuit comprising a plurality of stacked layers including a ground layer and a signal layer providing transmission lines for transmitting the first and second RF electrical signals between the transducer and control electronics of a host device, one end of the multi-layer flexible circuit being supported by the multi-layer ceramic package and electrically connected to the transducer, the other end of the multi-layer flexible circuit extending outwardly for connection with the control electronics of the host device;

wherein the multi-layer ceramic package includes a multi-layer ceramic structure, and a metal top cover fixed thereto with a transparent window hermetically sealing the transducer within the multi-layer ceramic package;

wherein the ground vias are disposed around the periphery of the multi-layer ceramic structure extending through the multi-layer ceramic structure from the metal top cover to the ground plane of the multi-layer flexible circuit, thereby forming a Faraday cage around the transducer, the ground vias and the signal vias for blocking electromagnetic interference.

6. The optical sub-assembly according to claim 5, wherein the ceramic structure is disposed perpendicular to the optical axis for enclosing the housing.

7. The optical sub-assembly according to claim 6, wherein the optical axis is laterally offset from the lens axis, whereby the beam of light is incident on the transducer at an angle between 80° and 87°.

8. The optical sub-assembly according to claim 7, wherein the optical connector, the lens and the housing are integrally formed with a mounting flange extending therefrom for fixing the ceramic package thereto.

9. The optical sub-assembly according to claim 5, wherein the metal top cap includes a cylindrical portion for extending into the housing, a rectangular base portion for covering the ceramic structure, and a transitional portion providing a transition between the cylindrical and rectangular portions.

10. The optical sub-assembly according to claim 1, further comprising control vias for transmitting one or more of power, control an monitoring signals between the transducer and the multi-layer flexible circuit; wherein an upper layer of the plurality of ceramic layers includes more control vias than a lower layer of the plurality of ceramic layers; wherein an upper surface of the upper layer has more solder pads than a lower surface of the lower layer; wherein the internal wiring layer includes conductors for electrically conducting a plurality of vias in the upper layer to a single via in the lower layer; whereby a plurality of solder pads on the upper surface of the upper layer are electrically connected to a single solder pad on the lower surface of the lower layer enabling a variety of connection arrangements for different transducers.

11. The optical sub-assembly according to claim 1, further comprising an index matching block within or adjacent the optical coupler having an index of refraction similar to that of the optical fiber, for limiting the amount of light reflected back into the optical fiber.

12. The optical sub-assembly according to claim 11, wherein the index matching block is surrounded by a trough for collecting unwanted debris entering the optical coupler.

13. The optical sub-assembly according to claim 1, further comprising live solder pads on a bottom surface of the multi-layer ceramic package for making live connections with corresponding transmission lines on the signal layer of the flexible circuit, and dummy solder pads adjacent to the live solder pads for connecting to the multi-layer flexible circuit, thereby limiting the amount of stress induced in the live connections.

14. The optical sub-assembly according to claim 1, wherein the transducer comprises a photo-detector mounted on top of a transimpedance amplifier.

15. The optical subassembly according to claim 14, wherein the photo-detector is flip-chip bonded on the transimpedance amplifier.

16. The optical sub-assembly according to claim 15, wherein the photo-detector is rear illuminated.

17. The optical sub-assembly according to claim 1, wherein the transducer, the multi-layer ceramic package, and the flexible circuit conductor are capable of transmitting at 10 Gbits/second.

18. The optical sub-assembly according to claim 5, wherein the transducer, the multi-layer ceramic package, and the flexible circuit conductor are capable of transmitting at 10 Gbits/second.

* * * * *